(12) United States Patent
Pagette et al.

(10) Patent No.: US 6,861,186 B1
(45) Date of Patent: Mar. 1, 2005

(54) METHOD FOR BACKSIDE ALIGNMENT OF PHOTO-PROCESSES USING STANDARD FRONT SIDE ALIGNMENT TOOLS

(75) Inventors: Francois Pagette, Fishkill, NY (US); Christopher M. Schnabel, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,368

(22) Filed: Sep. 25, 2003

(51) Int. Cl.⁷ .............................. G03F 9/00; G01B 11/00
(52) U.S. Cl. ........................ 430/22; 356/399; 356/401; 438/401
(58) Field of Search ........................... 430/22; 438/401; 356/399, 400, 401

(56) References Cited

U.S. PATENT DOCUMENTS

| 3,752,589 A | 8/1973 | Kobayashi .................. 356/172 |
| 4,669,175 A | 6/1987 | Ray |
| 5,985,764 A | 11/1999 | Lin et al. .................... 438/692 |
| 6,376,329 B1 | 4/2002 | Sogard et al. ............... 438/401 |
| 6,525,805 B2 | 2/2003 | Heinle ......................... 355/53 |

FOREIGN PATENT DOCUMENTS

| JP | 7147386 A | 6/1995 |

*Primary Examiner*—Christopher G. Young
(74) *Attorney, Agent, or Firm*—Delio & Peterson, LLC; Robert Curcio; Jay H. Anderson

(57) ABSTRACT

An image of an integrated circuit chip and optical kerf and their mirror image are formed within a single optical field. When a substrate pattern using this process is flipped over or reversed, the processed pattern appears the same as on the first side, equal to its own mirror image. Prior to the backside lithography, a portion of the second side is removed to allow detection of alignment marks on the first side from the second side of the substrate. Once the alignment marks are detected, the lithography continues as though the substrate was not flipped over at all.

19 Claims, 5 Drawing Sheets

METHOD FOR BACKSIDE ALIGNMENT OF PHOTO-PROCESSES USING STANDARD FRONT SIDE ALIGNMENT TOOLS

BACKGROUND OF INVENTION

The present invention relates generally to aligning patterns on substrates, and in particular, to accurate front-to-back alignment of patterns on a semiconductor wafer.

In semiconductor manufacturing, the processing steps for fabricating a semiconductor device involve exposing a substrate using a lithographic exposure system, such as exposing a semiconductor wafer coated with photosensitive material. This exposure requires aligning a reticle having a pattern of a particular device layer to an existing pattern on the substrate. After alignment, the reticle is exposed to radiation to which the photosensitive coating is sensitive, which transfers the reticle pattern onto the wafer.

Alignment marks and the alignment of subsequent lithographic patterns with respect to those marks are an important part of the semiconductor manufacturing process. Alignment of one pattern layer to previous layers is typically done with the assistance of special alignment patterns designed on a previous mask layer. When these special patterns are aligned, it is assumed that the remainder of the circuit patterns is also correctly aligned.

In some lithographic applications, the three-dimensional nature of the devices being produced requires precise alignment of the structure from the front side through the backside of the substrate. In certain cases, the substrate is processed on one side, and then flipped over and processed on the opposite side to create the desired three-dimensional structure. In such cases, the front side and backside must be properly aligned to form the patterned structure.

Conventional alignment of a pattern on the bottom surface of a wafer to a pattern on the top surface, i.e., front-to-back alignment, is typically done with either an infrared mask aligner for aligning through the substrate, or by requiring the wafer to have straight edges and using the straight edges as references for both top and bottom patterns. Other prior art methods include designing alignment markers, which are part of the metallization on the front side of the wafer, and exposing the markers by etching the wafer such that the backside pattern is directly aligned with the front side pattern using the etched alignment markers on the backside as the guide.

Backside processing of silicon wafers provides many challenges. The present invention addresses a problem in optical lithography concerning pattern alignment on the backside of wafers. Once a wafer is flipped over, alignment marks printed during topside processing are reversely aligned between different edges of the chip, as the mirror image of themselves. In this instance, the alignment marks on the reticle no longer line up with the alignment marks on the now upside-down wafer, since those on the wafer are located differently, as mirror images, whereas those on the reticle remain unchanged.

Currently, costly alignment tools are utilized to visually inspect the bottom of the wafer once the wafer is turned over (the former wafer top), for alignment marks while aligning subsequent masks to the wafer top (former wafer bottom). Another method for addressing this problem is to have the reticles aligned to the backside as mirror images of the data. Both solutions are costly and time consuming in application.

In U.S. Pat. No. 4,669,175 issued to Ray on Jun. 2, 1987, entitled "FRONT-TO-BACK ALIGNMENT PROCEDURE FOR BURRUS LED'S," a method for accurate front-to-back alignment is taught where a metallization layer has perpendicular alignment indicia intersecting at metal contact on the front surface of the wafer. The perimeter of the wafer is etched away to reveal the alignment indicia, which are detected and visible from the backside of the wafer. The back surface contact pattern is then aligned using the newly exposed part of the top surface, i.e., the front side alignment indicia.

In Japanese Patent JP7147386A issued to Kozuka Eiji and published on Jun. 6, 1995, entitled "SEMICONDUCTOR DEVICE AND ITS MANUFACTURING METHOD AND APPARATUS USED FOR IT," patterns for two chips, namely one chip of normal type and one chip of reverse type, are formed on the same mask blank. The same data in an integrated circuit data region formed on each semiconductor chip are shared and the direction is the mirror image for the layout; however, the chip is not flipped over for processing where the mirrored image pattern could be used for alignment purposes, nor are any alignment modifications made to the backside.

In U.S. Pat. No. 3,752,589 issued to Masaaki Kobayashi on Aug. 14, 1973, entitled "METHOD AND APPARATUS FOR POSITIONING PATTERNS OF A PHOTOGRAPHIC MASK ON THE SURFACE OF A WAFER ON THE BASIS OF BACKSIDE PATTERNS OF THE WAFER," a method of aligning the pattern of a photo mask on one side of a wafer to the patterns placed on the underside of the wafer is taught. The alignment of the mask with respect to the wafer is achieved by optically superimposing the images present on the mask and on the underside of the wafer and adjusting the mask relative to the wafer until the relative positions of the combined images are corrected to a predefined set of conditions. This method requires two viewing apparatus: one for the mask facing the wafer and the other on the opposing side facing the underside of the wafer. Moreover, this art requires an etch from the front side rather than backside processing techniques.

Bearing in mind the problems and deficiencies of the prior art, it is therefore an object of the present invention to provide a method for pattern alignment on the backside of wafers.

It is another object of the present invention to provide a method for pattern alignment using front side alignment tools.

A further object of the present invention is to provide a method to solve the problem associated with alignment marks that are printed during topside processing and become reversely aligned between different edges of the chip on the backside.

Still other objects and advantages of the invention will in part be obvious and will in part be apparent from the specification.

SUMMARY OF INVENTION

The above and other objects, which will be apparent to those skilled in art, are achieved in the present invention, which is directed to a method of aligning a set of lithographic patterns to one another on a substrate during a lithographic process, the substrate having a front side surface and a backside surface, the method comprising: providing a symmetric data image on the front side surface such that the symmetric image is identical whether viewed from the front side or the backside; generating a pattern of the front side surface image on the substrate; flipping the substrate; detecting the generated pattern; and aligning subsequent lithographic process steps to the detected generated pattern. The symmetric data further comprises integrated circuit chip data or kerf data or both within a single optical field. The generated pattern includes alignment marks. The generated pattern is on the substrate's backside. The alignment marks may be on a trench level or a device isolation level. The alignment marks are mirrored symmetrically about an axis. An original image of a portion of the symmetric data may be defined by a plurality of coordinates.

The method further includes: multiplying coordinates in one dimension by negative 1 to create coordinates of a mirror image of the portion of the symmetric data; and merging the mirror image with the portion of the symmetric data. The method may also include adding a constant value to the coordinates of the merged data such that the origin is aligned with a lower left corner.

The generated pattern may be detected by removing a portion of the substrate's backside. The alignment marks may also be detectable on the backside surface after the removal of the portion of the substrate's backside.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

In describing the preferred embodiment of the present invention, reference will be made herein to FIGS. 1–5 of the drawings in which like numerals refer to like features of the invention.

The present invention provides a mirror image of the integrated circuit chip and scribe channel or kerf within a single optical field. When the wafer is flipped over or reversed, the chip appears the same as it is on the first side, that is, equal to its own mirror image. Prior to the backside lithography, wafer is flipped, bonded to a secondary substrate or given other means of mechanical support, and then a backside grind or etch is performed on the wafer such that the front side alignment marks are detected from the backside. These alignment marks are preferably on a trench mask or level, a device isolation level, or the like, but may be on other masks as well. Once the alignment marks are made detectable, the lithography may continue as though the wafer was not flipped over at all. Thus, no special tools are required for further processing, as only standard lithography and alignment marks are used. Since the reticles are not ordered backwards, design verification may be achieved by performing front side processing.

Figure 1:
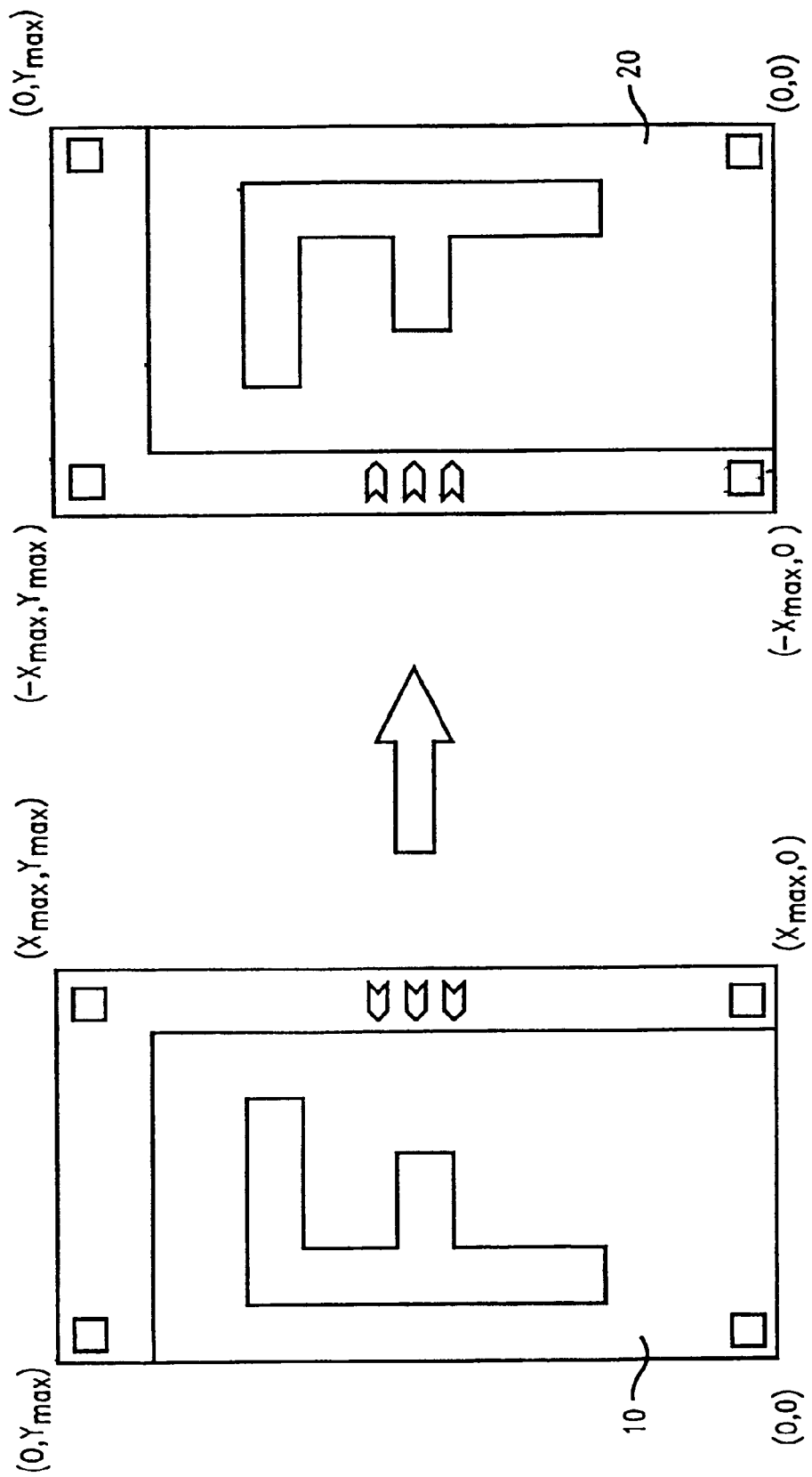
FIG. 1 depicts the first step in the process of mirroring the mask data about an axis.
Figure 2:
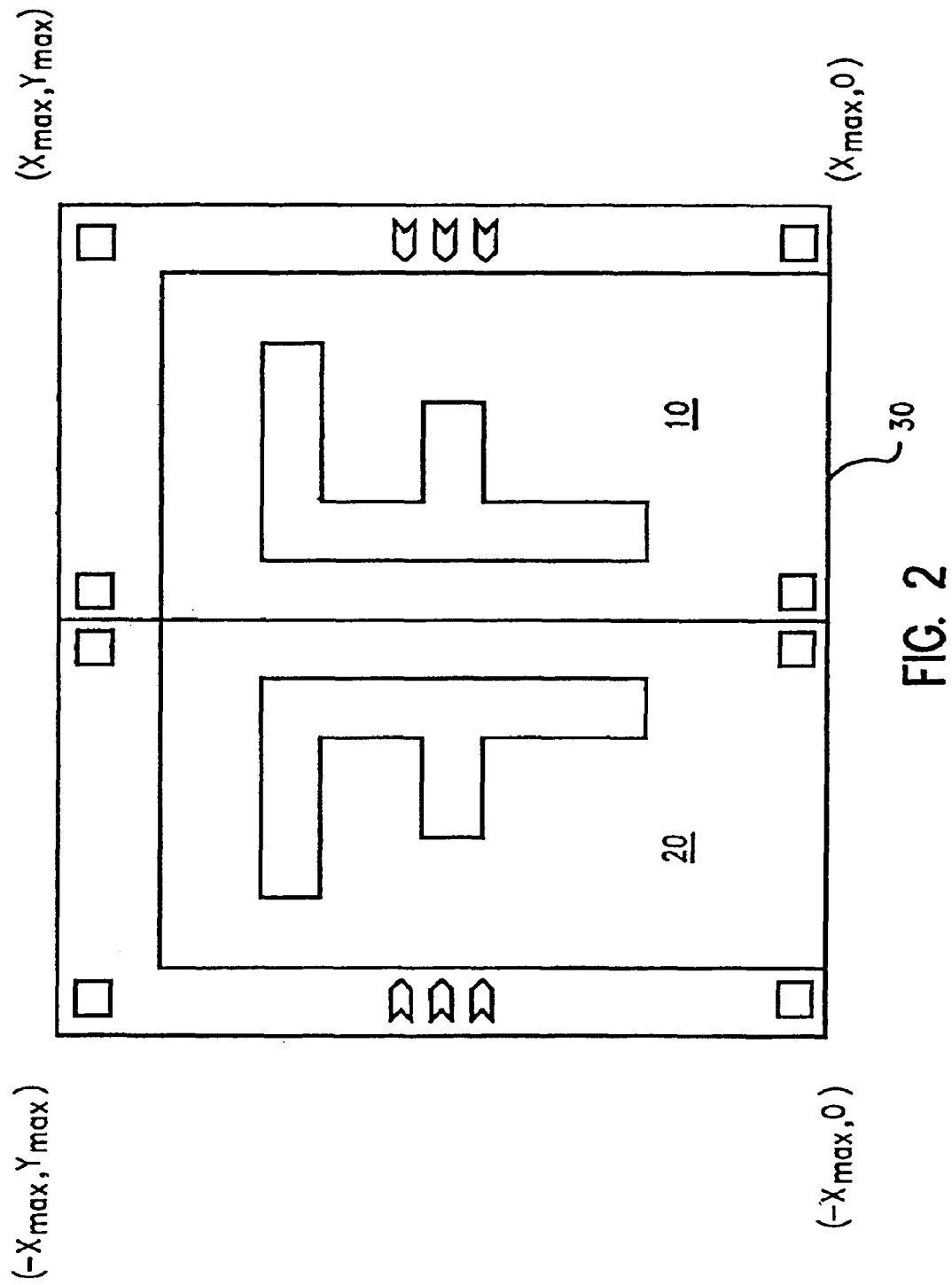
FIG. 2 depicts the result when the original data is merged with the inverted data.
Figure 3:
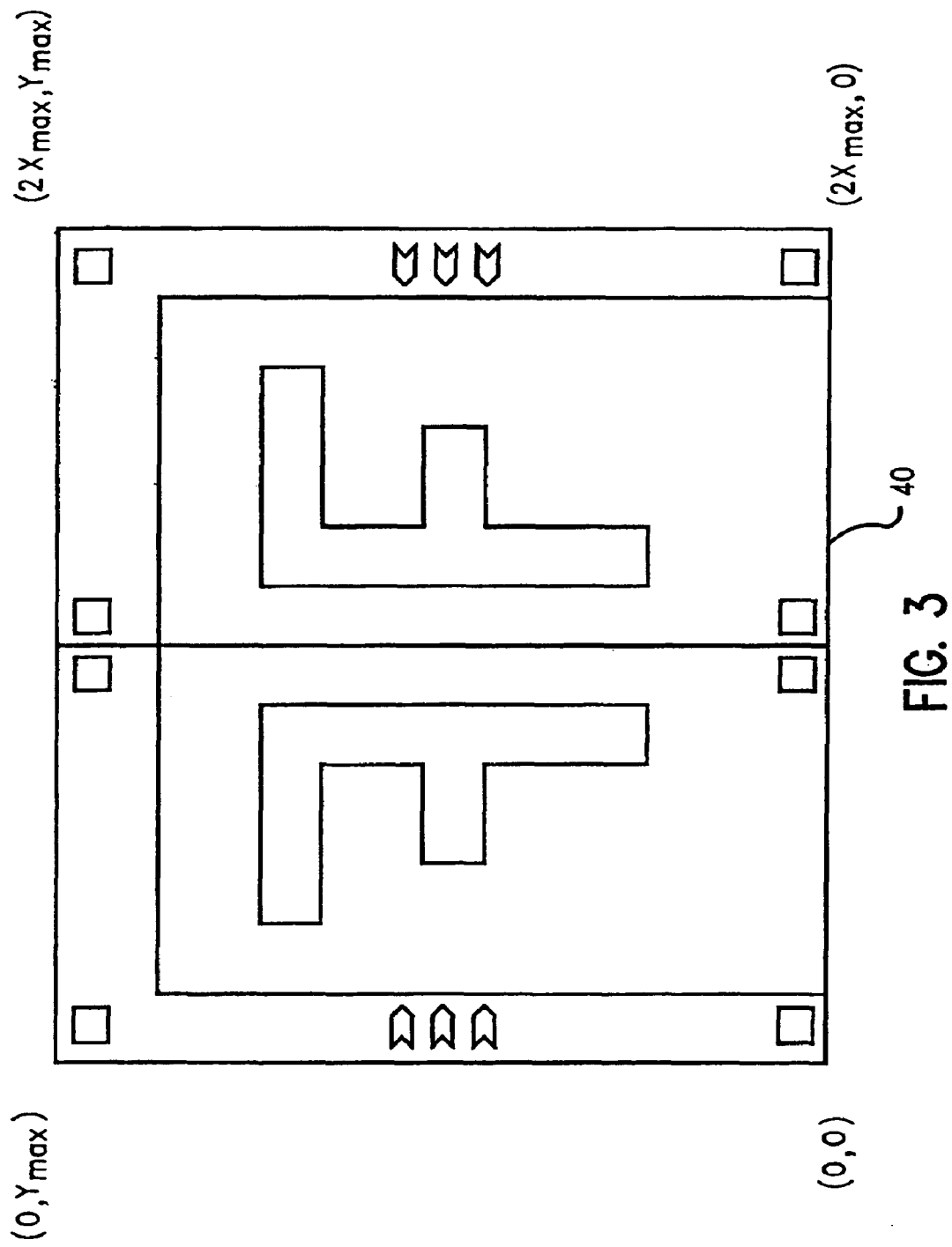
FIG. 3 depicts the resultant original image and corresponding inverted image with defined upper and lower coordinates.

FIG. 1 depicts the first step in the process of converting non-symmetric data to symmetric data about an axis, preferably the ordinate or Y-axis. An original image 10 is defined with its origin at its lower left corner, such that the upper corner coordinates may be represented by (0, Y) and ($X_{max}$, $Y_{max}$), and the lower corner coordinates represented by the origin (0, 0) and ($X_{max}$, 0). All data points in one dimension are then multiplied by 1 to create a mirror image 20. After this multiplication, the corresponding corner coordinates of the mirror image may be represented as ($-X_{max}$, $Y_{max}$) and (0, $Y_{max}$) for the upper corner coordinates and ($-X_{max}$, 0) and (0, 0) for the lower corner coordinates, respectively. FIG. 2 depicts the result 30 when the original data 10 is merged with the inverted data 20. For computational simplicity, a constant value $X_{max}$ is then added to all points converting the coordinates such that the origin (0, 0) is again aligned with the lower left corner. FIG. 3 depicts the resultant combined image 40, the original image and corresponding inverted image, with upper coordinates (0, $Y_{max}$) and ($2*X_{max}$, $Y_{max}$), and lower coordinates (0, 0) and ($2*X_{max}$, 0).

As indicated by the process flow above, the data is mirrored with the kerf already attached. However, this is not a requisite condition as the kerf may be mirrored independently and submitted to the mask house unmerged. In this case, each orientation of the design may be submitted to the mask house as two different chips. In either scenario, the resultant reticles will appear as the last image 40 of FIG. 3.

Figure 4:
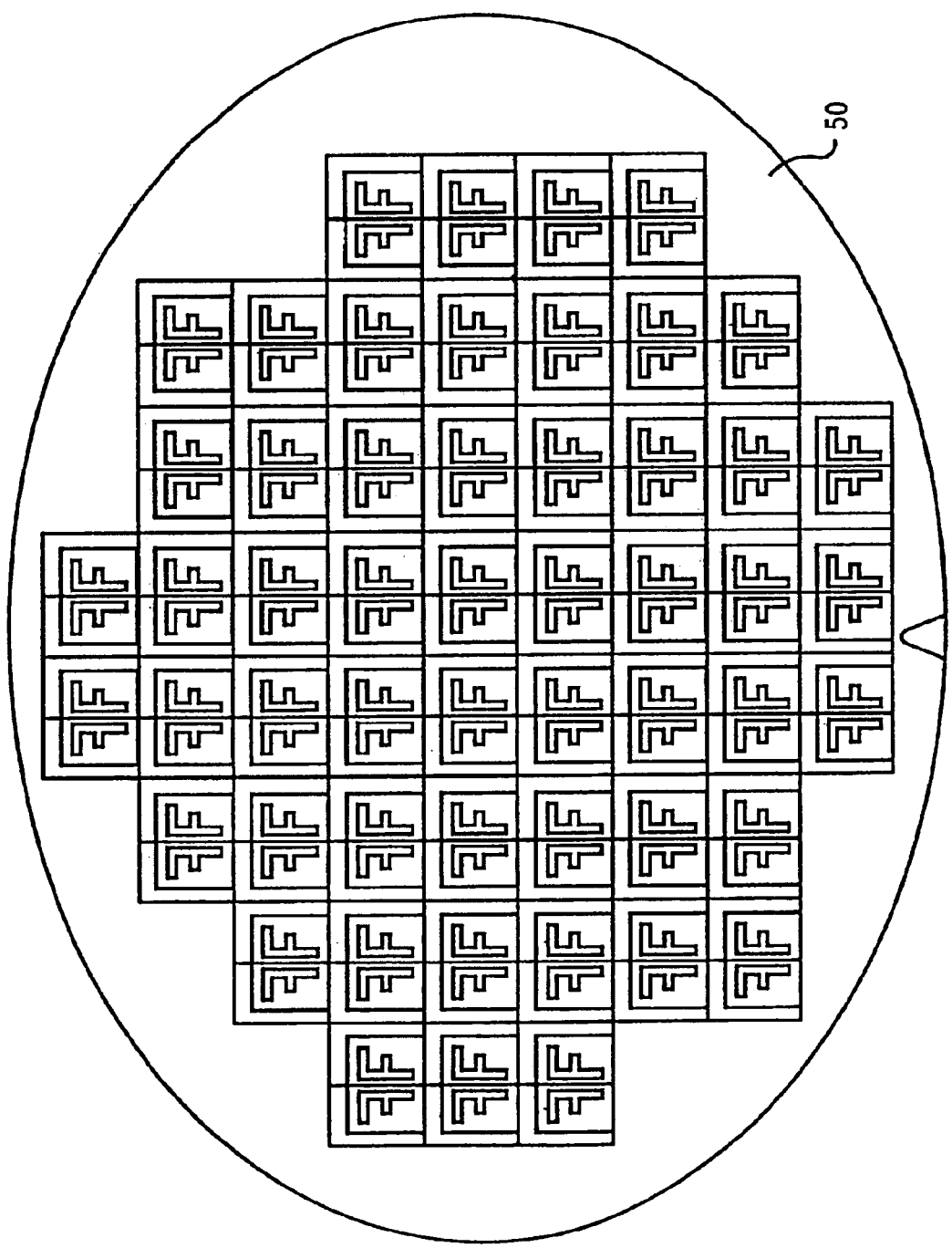
FIG. 4 depicts an example of a printed wafer using the mirrored imaging of the present invention.
Figure 5:
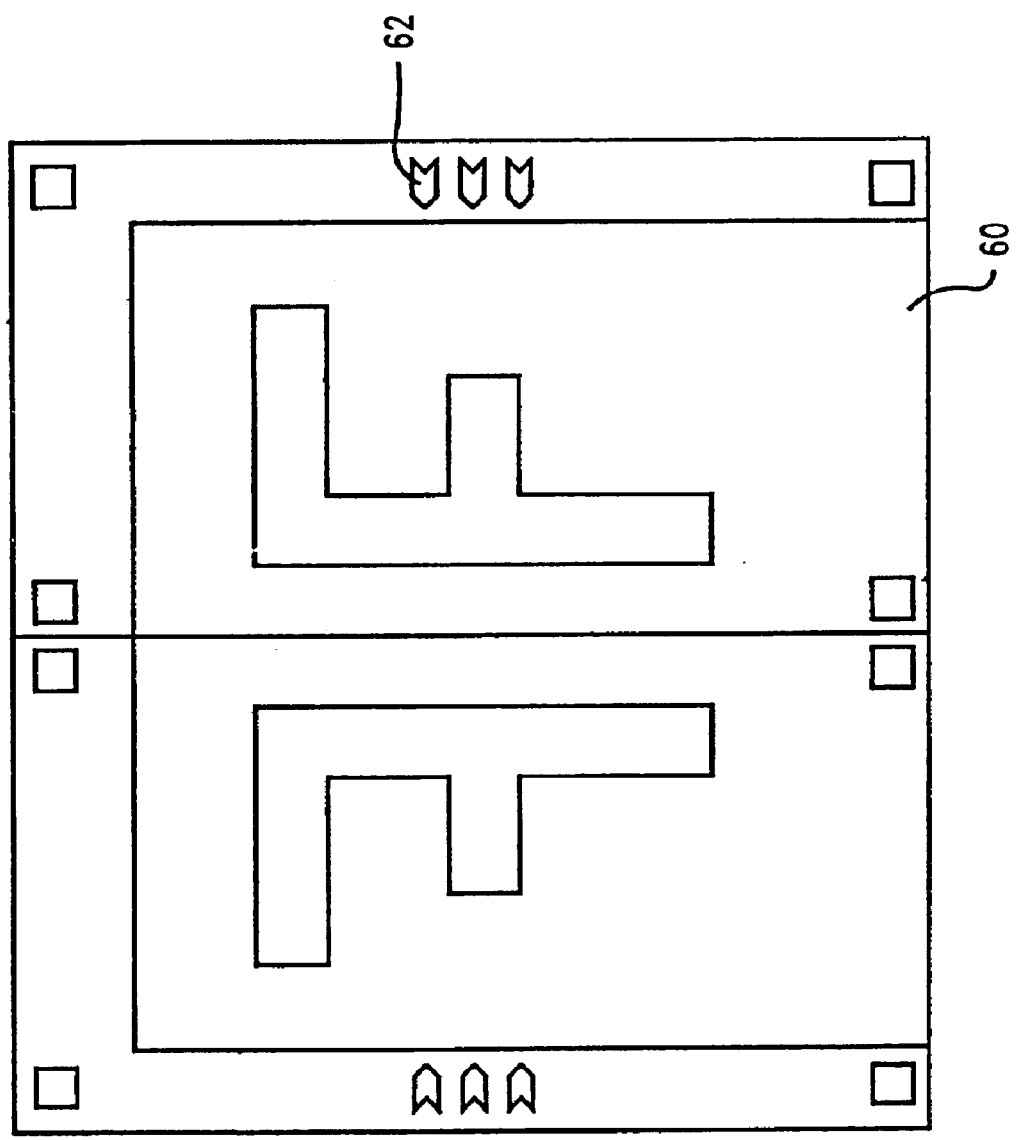
FIG. 5 depicts a single exposure field with shapes representing arbitrary alignment marks.

FIG. 4 depicts an example of a printed wafer 50 using the mirrored imaging of the present invention. Importantly, as the lithography is done, exposure field by exposure field, the alignment marks may not have to be symmetrical; however, they must be mirrored symmetrically about an axis, in this case, the same axis as that of the image data. FIG. 5 depicts a single exposure field 60 with some shapes representing arbitrary alignment marks 62. As noted, these alignment marks are shown mirrored symmetrically about the Y-axis.

After front side processing, the exposed field can be represented as shown in FIG. 5. In the present case, the alignment marks to which most masks are aligned are on a trench mask or level, a device isolation level, or the like. Significantly, the backside masks will align to a level to which front side masks may align as well. This enables second order alignment to any other front side mask that can align to a trench mask or level, a device isolation level, or the like. The alignment marks can be seen on the backside after a series of steps where the wafer is flipped and bonded to a mechanical support structure, such as an additional wafer, and then an etch or grind-processing step or the like is applied. Since the wafer is flipped over, the alignment marks now on the right side of each chip are those originally printed on the left side of each chip. However, due to the symmetry achieved by mirroring the chip and the kerf, this serves to align the patterns transferred from the masks to the wafer's backside as if the wafer was never flipped over.

Implementation of the present invention makes the flipping of the wafer a transparent step to the lithography process. This allows, with small process variations, lower cost design verification during all processing without flipping the wafer. This would not be possible if solutions of the prior art were to be implemented. If masks are simply ordered reversed from left to right, they cannot be used for front side processing to perform the design verification. The method of the present invention resolves this process condition.

While the present invention has been particularly described, in conjunction with a specific preferred Thus, having described the invention, what is claimed is:

1. A method of aligning a set of lithographic patterns to one another on a substrate during a lithographic process, said substrate having a front side surface and a backside surface, said method comprising:

providing a symmetric data image on said front side surface such that said symmetric image is identical whether viewed from said front side or said backside;

generating a pattern of said front side surface image on said substrate;

flipping said substrate;

detecting said generated pattern; and aligning subsequent lithographic process steps to said detected generated pattern.

2. The method of claim 1 wherein said symmetric data further comprises integrated circuit chip data.

3. The method of claim 1 wherein said symmetric data further comprises kerf data.

4. The method of claim 1 wherein said symmetric data comprises both integrated circuit chip data and kerf data within a single optical field.

5. The method of claim 1 comprising generating said pattern such that said generated pattern includes alignment marks.

6. The method of claim 1 including bonding said substrate to a mechanical support structure.

7. The method of claim 5 further comprising having said alignment marks on a trench level or a device isolation level.

8. The method of claim 5 further comprising mirroring said alignment marks symmetrically about an axis.

9. The method of claim 2 comprising defining an original image of a portion of said symmetric data by a plurality of coordinates.

10. The method of claim 9 including defining four corner coordinates of said plurality of coordinates as $(0, Y_{max})$, $(X_{max}, Y_{max})$, an origin $(0, 0)$ and $(X_{max}, 0)$.

11. The method of claim 10 further comprising mirroring said portion of said symmetric data about an axis.

12. The method of claim 11 wherein said axis is an ordinate axis.

13. The method of claim 11 further including:

multiplying coordinates in one dimension by negative 1 to create coordinates of a mirror image of said portion of said symmetric data; and merging said mirror image with said portion of said symmetric data.

14. The method of claim 13 wherein said four corner coordinates are represented by $(0, Y_{max})$, $(-X_{max}, Y_{max})$, $(0, 0)$ and $(-X_{max}, 0)$, after said multiplying step.

15. The method of claim 13 further including adding a constant value to said coordinates of said merged data such that said origin is aligned with a lower left corner.

16. The method of claim 15 wherein said constant value comprises $X_{max}$, such that said four corner coordinates of said merged data are further represented by $(0, Y_{max})$, $(2*X_{max}, Y_{max})$, $(0, 0)$ and $(2*X_{max}, 0)$.

17. The method of claim 5 wherein said alignment marks are on a trench level or device isolation level.

18. The method of claim 1 wherein said generated pattern is detected by removing a portion of said substrate's backside.

19. The method of claim 18 wherein said alignment marks are detectable on said backside surface after said removal of said a portion of said substrate's backside.

* * * * *